(12) United States Patent
Kwan et al.

(10) Patent No.: US 6,498,350 B2
(45) Date of Patent: Dec. 24, 2002

(54) CRASH PREVENTION IN POSITIONING APPARATUS FOR USE IN LITHOGRAPHIC PROJECTION APPARATUS

(75) Inventors: Yim Bun P. Kwan, Eindhoven (NL); Engelbertus A. F. van de Pasch, Oirschot (NL); Andreas B. G. Ariens, Utrecht (NL); Edwin J. Buis, Belfeld (NL); Jan F. Hoogkamp, Veldhoven (NL); Robert-Han Munnig Schmidt, Hapert (NL)

(73) Assignee: ASML Netherlands B.V., Veldhoven (NL)

( * ) Notice: Subject to any disclaimer, the term of this patent is extended or adjusted under 35 U.S.C. 154(b) by 189 days.

(21) Appl. No.: 09/739,106

(22) Filed: Dec. 19, 2000

(65) Prior Publication Data
US 2001/0004105 A1 Jun. 21, 2001

(30) Foreign Application Priority Data

Dec. 21, 1999 (EP) .............................. 99310289
Aug. 25, 2000 (EP) .............................. 00202955

(51) Int. Cl.$^7$ ............................... H01J 37/13
(52) U.S. Cl. .............................. 250/442.11; 250/441.11; 250/440.11; 250/492.22; 250/492.2; 269/37; 269/45
(58) Field of Search ....................... 250/442.11, 441.11, 250/440.11, 492.22, 492.2; 269/37, 45

(56) References Cited

U.S. PATENT DOCUMENTS 6,086,457 A * 7/2000 Perlov et al. ................. 451/41

* cited by examiner

Primary Examiner—John R. Lee
Assistant Examiner—Nikita Wells
(74) Attorney, Agent, or Firm—Pillsbury Winthrop LLP

(57) ABSTRACT

In a multi-table lithographic apparatus in which substrate tables may be exchanged between a first working zone where substrates are loaded onto and removed from the table and a second working zones where wafers are exposed, collision prevention means are provided to prevent collisions between tables in the exchange process. The collision prevention means may be formed of a labyrinth or a revolving door. The exchange process may be controlled by shuttles, optionally including drive means, that are interlinked so that the tables can only be exchanged between zones together.

16 Claims, 12 Drawing Sheets

CRASH PREVENTION IN POSITIONING APPARATUS FOR USE IN LITHOGRAPHIC PROJECTION APPARATUS

BACKGROUND OF THE INVENTION

1. Field of the Invention

The present invention relates to crash prevention in positioning apparatus in lithographic projection apparatus comprising:

an illumination system for supplying a projection beam of radiation;

a first object table for holding patterning means capable of patterning the projection beam according to a desired pattern;

a second movable object table for holding a substrate;

a third moveable object table for holding second patterning means or a second substrate; and a projection system for imaging the patterned beam onto a target portion of the substrate.

2. Description of the Related Art

The term "patterning means" should be broadly interpreted as referring to means that can be used to endow an incoming radiation beam with a patterned cross-section, corresponding to a pattern that is to be created in a target portion of the substrate; the term "light valve" has also been used in this context. Generally, the said pattern will correspond to a particular functional layer in a device being created in the target portion, such as an integrated circuit or other device (see below). Examples of such patterning means include:

A mask held by said first object table. The concept of a mask is well known in lithography, and its includes mask types such as binary, alternating phase-shift, and attenuated phase-shift, as well as various hybrid mask types. Placement of such a mask in the projection beam causes selective transmission (in the case of a transmissive mask) or reflection (in the case of a reflective mask) of the radiation impinging on the mask, according to the pattern on the mask. The first object table ensures that the mask can be held at a desired position in the incoming projection beam, and that it can be moved relative to the beam if so desired.

A programmable mirror array held by a structure that is referred to as first object table. An example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. The required matrix addressing can be performed using suitable electronic means. More information on such mirror arrays can be gleaned, for example, from U.S. Pat. Nos. 5,296,891 and 5,523,193, which are incorporated herein by reference.

A programmable LCD array held by a structure that is referred to as first object table. An example of such a construction is given in U.S. Pat. No. 5,229,872, which is incorporated herein by reference.

For purposes of simplicity, the rest of this text may, at certain locations, specifically direct itself to examples involving a mask; however, the general principles discussed in such instances should be seen in the broader context of the patterning means as hereabove set forth.

For the sake of simplicity, the projection system may hereinafter be referred to as the "lens"; however, this term should be broadly interpreted as encompassing various types of projection system, including refractive optics, reflective optics, and catadioptric systems, for example. The illumination system may also include components operating according to any of these design types for directing, shaping or controlling the projection beam of radiation, and such components may also be referred to below, collectively or singularly, as a "lens". In addition, the first and second object table may be referred to as the "mask table" and the "substrate table", respectively.

Lithographic projection apparatus can be used, for example, in the manufacture of integrated circuits (ICs). In such a case, the mask (reticle) may contain a circuit pattern corresponding to an individual layer of the IC, and this pattern can be imaged onto a target portion (comprising one or more dies) on a substrate (silicon wafer) which has been coated with a layer of radiation-sensitive material (resist). In general, a single substrate will contain a whole network of adjacent target portions that are successively irradiated via the mask, one at a time. In one type of lithographic projection apparatus, each target portion is irradiated by exposing the entire mask pattern onto the target portion at once; such an apparatus is commonly referred to as a wafer stepper. In an alternative apparatus—which is commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed at which the substrate table is scanned will be a factor M times that at which the mask table is scanned. More information with regard to lithographic devices as here described can be gleaned from International Patent Application WO 97/33205.

In general, apparatus of this type contained a single first object (mask) table and a single second object (substrate) table. However, machines are becoming available in which there are at least two independently movable substrate tables; see, for example, the multi-stage apparatus described in U.S. Pat. No. 5,969,441 and U.S. Ser. No. 09/180,011, filed Feb. 27, 1998 (WO 98/40791), incorporated herein by reference. The basic operating principle behind such a multi-stage apparatus is that, while a first substrate table is underneath the projection system so as to allow exposure of a first substrate located on that table, a second substrate table can run to a loading position, discharge an exposed substrate, pick up a new substrate, perform some initial metrology steps on the new substrate, and then stand by to transfer this new substrate to the exposure position underneath the projection system as soon as exposure of the first substrate is completed, whence the cycle repeats itself; in this manner, it is possible to achieve a substantially increased machine throughput, which in turn improves the cost of ownership of the machine.

Another type of twin-table apparatus is described in WO98/24115. This apparatus has two characterization zones and a single exposure zone. The two substrate tables are moved between their respective characterization zones and the exposure zone. The software controlling the apparatus ensures that the two tables are not brought to the exposure zone at the same time.

The present inventors have determined that in a multiple table apparatus where tables are exchanged between different zones there is a particular risk of collision between tables. In a lithography apparatus the tables are heavy and are moved at quite high speeds. They are also made of extremely brittle materials and carry many delicate components whose position is required to be known to very high accuracy. Accordingly, the effects of any collision between tables, even a low speed one, can be very serious. A major collision causing significant damage to the delicate components of a table may render the whole apparatus unusable due to fractures or permanent deformation of precision parts. Of course, the software controlling the apparatus can be written to prevent movements of the tables that would bring them into collision but software errors, errors caused by interference or power spikes or unexpected power losses may still lead to collisions.

SUMMARY OF THE INVENTION

An object of the present invention is to provide a multiple object positioning system whereby collisions between the objects being positioned can be avoided and/or the effects of any collisions ameliorated.

According to the present invention there is provided a lithographic projection apparatus comprising:
- an illumination system for supplying a projection beam of radiation;
- a first object table for holding patterning means capable of patterning the projection beam according to a desired pattern;
- second and third movable object tables each for holding a substrate, said second and third object tables being movable over a common range of movement including at least first and second working zones; and
- a projection system for imaging the patterned beam onto a target portion of the substrate, and
- table positioning means for moving said second and third object tables; characterized by:
  - collision prevention means physically limiting movement of at least one of said second and third object tables for preventing collisions between said second and third object tables.

According to a further aspect of the invention there is provided a lithographic projection apparatus comprising:
- an illumination system for supplying a projection beam of radiation;
- first and second movable object tables each for holding patterning means capable of patterning the projection beam according to a desired pattern, said first and second object tables being moveable over a common range of movement including at least first and second working zones;
- a third movable object table for holding a substrate;
- a projection system for imaging the patterned beam onto a target portion of the substrate; and
- table positioning means for moving said first and second object tables; characterized by:
  - collision prevention means physically limiting movement of at least one of said first and second object tables for preventing collisions between said first and second object tables.

The collision prevention means, which comprises a physical movement limiter, e.g. a barrier, rather than relying wholly on software for crash prevention, ensure that collisions are avoided even in the event of a catastrophic failure of the device, such as major power loss or serious system failure. The potential for expensive and/or irreparable damage to the substrate or mask tables in such circumstances is avoided.

According to yet a further aspect of the invention there is provided a method of manufacturing a device using a lithographic projection apparatus comprising:
- an illumination system for supplying a projection beam of radiation;
- a first object table for holding patterning means capable of patterning the projection beam according to a desired pattern;
- second and third movable object tables each for holding a substrate, said second and third object tables being moveable over a common range of movement including at least first and second working zones;
- a projection system for imaging the patterned beam onto a target portion of the substrate; and
- table positioning means for moving said second and third object tables; the method comprising the steps of:
  - providing a projection beam of radiation using the illumination system;
  - using the patterning means to endow the projection beam with a pattern in its cross-section;
  - positioning said second object table in said first working zone and said third object table in said second working zone;
  - providing a first substrate having a radiation-sensitive layer to said second object table in said first working area;
  - exchanging said second and third object tables between said first and second working zones;
  - projecting the patterned beam of radiation onto a target portion of the layer of radiation-sensitive material of said first substrate provided to said second object table;
  - providing a second substrate having a radiation-sensitive layer to said third object table in said first working area; and
  - again exchanging said second and third object tables between said first and second working zones; characterized in that:
    - during said steps of exchanging said second and third object tables, collision prevention means physically limiting movement of at least one of said second and third object tables are provided to prevent collisions between said second and third object tables.

In a manufacturing process using a lithographic projection apparatus according to the invention a pattern in a mask is imaged onto a substrate which is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation or particle flux, including, but not limited to, ultraviolet (UV) radiation (e.g. with a wavelength of 365, 248, 193, 157 or 126 nm), extreme ultraviolet (EUV) radiation, X-rays, electrons and ions.

BRIEF DESCIPTION OF THE DRAWINGS

The present invention will be described below with reference to exemplary embodiments and the accompanying schematic drawings, in which.

In the drawings, like reference numerals indicate like parts.

Embodiment 1

DETAILED DESCIPTION OF THE EMBODIMENTS

Figure 1:
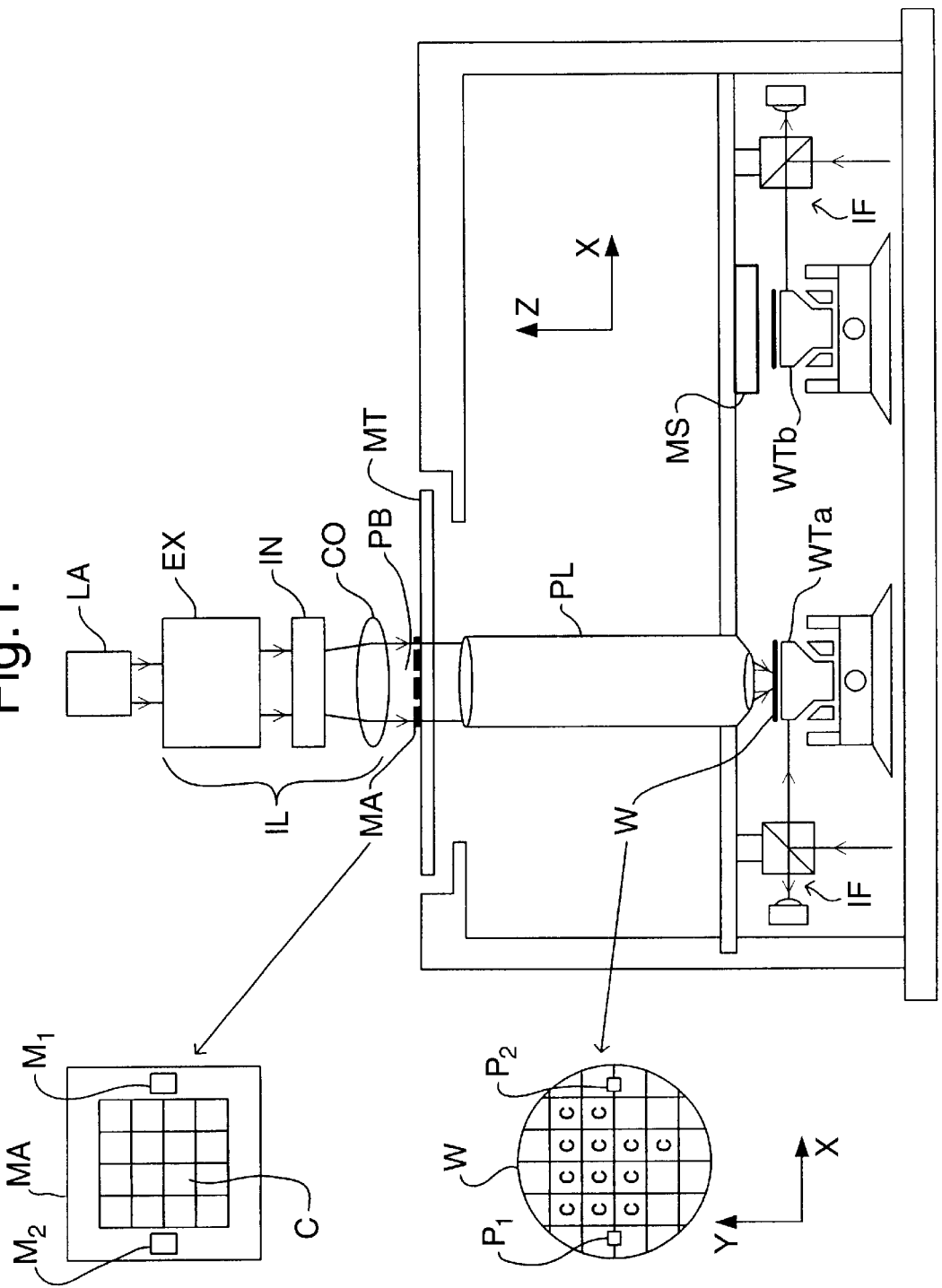
FIG. 1 depicts a lithographic projection apparatus according to a first embodiment of the invention.

FIG. 1 schematically depicts a lithographic projection apparatus according to the invention. The apparatus comprises:

a radiation system LA, IL for supplying a projection beam PB of radiation (e.g. UV or EUV radiation);

a first object table (mask table) MT provided with a mask holder for holding a mask MA (e.g. a reticle), and connected to first positioning means for accurately positioning the mask with respect to item PL;

second and third object tables, (substrate table) WTa, WTb each provided with a substrate holder for holding a substrate W (e.g. a resist-coated silicon wafer), and connected to second and third positioning means for accurately positioning the substrate with respet to items PL and MS;

a projection system ("lens") PL (e.g. a refractive or catadioptric system, a mirror group or an array of field deflectors) for imaging an irradiated portion of the mask MA onto a target portion C of the substrate W.

As here depicted, the apparatus is of a transmissive type, (i.e. has a transmissive mask). However, in general, it may also be of a reflective type, for example.

In the example, depicted here, the radiation system comprises a source LA (e.g. a Hg lamp, excimer laser, an undulator provided around the path of an electron beam in a storage ring or synchrotron, or an electron or ion beam source) which produces a beam of radiation. This beam is passed along various optical components comprised in the illumination system IL, e.g. beam shaping optics Ex, an integrator IN and a condenser CO, so that the resultant beam PB has a desired shape and intensity distribution.

The beam PB subsequently intercepts the mask MA which is held in a mask holder on a mask table MT. Having passed through the mask MA, the beam PB passes through the lens PL, which focuses the beam PB onto a target portion C of the substrate W. With the aid of the interferometric displacement measuring means IF and the second positioning means, the substrate tables WTa, WTb can be moved accurately, e.g. so as to position different target portions C in the path of the beam PB. Similarly, the first positioning means can be used to accurately position the mask MA with respect to the path of the beam PB, e.g. after mechanical retrieval of the mask MA from a mask library. In general, movement of the object tables MT, WT will be realized with the aid of a long stroke module (course positioning) and a short stroke module (fine positioning), which are not explicitly depicted in FIG. 1.

The depicted apparatus can be used in two different modes:

1. In step mode, the mask table MT is kept essentially stationary, and an entire mask image is projected in one go (i.e. a single "flash") onto a target portion C. The substrate table WT is then shifted in the x and/or y directions so that a different target portion C can be irradiated by the beam PB;

2. In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WTa or WTb is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 2:
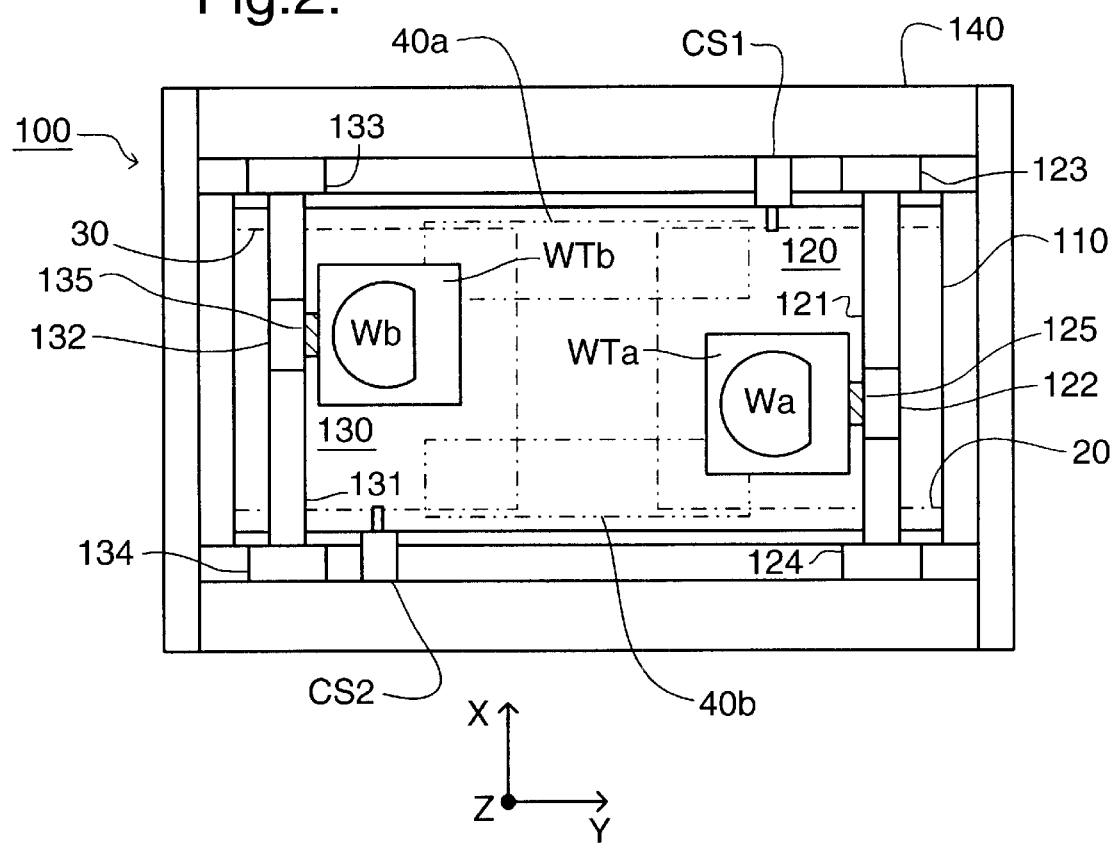
FIG. 2 is a plan view of the wafer stage of the apparatus of FIG. 1 with the two wafer tables in operating positions.

FIG. 2 shows the wafer stage 100 of the lithography apparatus of embodiment 1 in plan. The core of wafer stage 100 is formed by reference table, or stone, 110 which has a flat, level upper surface over which two wafer tables WTa, WTb can move. Wafer tables WTa and WTb are essentially identical and each includes a wafer holder (not shown) for respective wafers Wa, Wb and an air foot (air bearing) to support the table so that it can be moved essentially without friction over the reference table 110. The wafer tables are positioned by two drive units 120, 130, which are of a known H-drive arrangement. Each drive consists of an X-beam 121, 131 on which is mounted the stator of an X-linear motor which drives an X-slider 122, 132 longitudinally of the beam. Wafer tables WTa and WTb are kinematically coupled to respective ones of the X-sliders 122, 132 by releasable stage couplings 125, 135. Each end of each X-beam is mounted on a Y-slider 123, 124, 133, 134 which can be driven by Y-linear motors (not shown), the stators of which are mounted on a balance mass 140 which takes the form of a rectangular frame surrounding the reference table 110. The wafer tables WTa, WTb are thus positioned in the X direction by driving the X-sliders 122, 132 along X-beams 121, 131 and in the Y direction by driving the X-beam via the Y-sliders 123, 124, 133, 134. The tables can also be rotated about axes parallel to the Z direction by independent control of the Y-sliders 123, 124, 133, 134.

The X and Y directions in which the respective linear motors act are generally orthogonal to each other and parallel to the top surface of the reference table 110. However, as mentioned above, the two Y-sliders 123, 124, 133, 134 in each drive unit may be positioned independently, within certain limits, to control the Rz position of the wafer tables WTa, WTb which will result in the X-beam no longer being exactly perpendicular to the Y-motors in balance mass 140.

The H-drive units 120, 130 effectively comprise the long stroke module for coarse positioning of the wafer tables whilst the short stroke modules for fine positioning of the wafers are included in the respective wafer tables WTa, WTb.

At one end of the reference table 110 is situated an expose zone 20 at which a mask image can be projected onto a wafer to expose the radiationsensitive layer. At the other end there is a preparation (characterization) zone 30 at which wafers may be loaded onto and removed from the wafer tables and any preparatory steps, e.g. measurement process to establish the exact position of the wafer on the table in 6 degrees of freedom, can be carried out. The exposure process is carried out as described above whilst the loading, removal and preparatory steps can be carried out in a known way by known apparatus, not described herein for the sake of brevity. In the present embodiment, the H-drive units 120, 130 covering the two zones 20, 30 are equivalent though they need not be if the required ranges of movement, speeds and accelerations of the wafer tables in the two zones are different.

As mentioned above, wafer tables WTa, WTb are kinematically coupled to X-sliders 122, 132 by releasable couplings 125, 135. The couplings 125, 135 are arranged so as to be able to couple to both wafer tables WTa, WTb and to respective sides thereof. In the table swap process, described in more detail below, the two tables are brought to positions in transfer zones 40a, 40b, the couplings 125, 135 are released and the X-sliders moved to the other wafer table, to which they are then coupled.

Couplings 125, 135, when connected, transmit forces in the XY plane, that is X and Y translational forces and Rz torques, between wafer table and respective X-slider. For increased positioning accuracy, the coupling may however be free in the other degrees of freedom, that is Z translation and Rx and Ry rotations. Such freedom may be provided, for example, by including in the coupling a leaf spring lying in the plane of the forces to be transmitted.

The coupling may transmit the in-plane forces by a frictional coupling (e.g. a caliper clamp on single or multiple laminates) or an interlocking device (e.g. using pins engaging in holes or recesses or interlocking v-shaped grooves and ridges). With a frictional coupling the clamp may be engaged within a range of relative positions of the X-slider and wafer table so that the requirement for accurate positioning of the sliders during the table swap process is reduced. On the other hand, an interlocking device requires a lower clamping force and hence a smaller and less energy-consuming device can be used. The coupling may also employ a combination of frictional and interlocking principles and may employ different coupling methods in different directions according to the differing force transmission requirements in those directions.

To prevent loss of coupling action in the event of power or other machine failure, the coupling is of a type which in its natural state is closed (attached) and requires powered actuation to open (detach), or is bi-stable and requires powered actuation to switch between open and closed states. Examples of such types of coupling include clamps biased closed by elastic energy, e.g. provided by helical or conical spring stacks, magnetic energy provided by permanent magnets, electrical energy provided by electrostatic forces or the potential energy of a mass of gas under elevated pressure. The opening force acting against the passive closing force can be pneumatic, hydraulic (preferably using ultra-pure water to minimize the chance of contamination) or electromagnetic, etc. Since the stroke of the coupling between open and closed positions is likely to be small, a transmission mechanism with a large mechanical advantage can be used between the actuator and clamp. Examples of such transmission mechanisms include single or multistage lever systems, pneumatic/hydraulic boosters, etc. Furthermore, a transmission mechanism having a variable mechanical advantage and providing full clamping force only in the last part of the stroke may be used, for example a so-called toggle mechanism or a lever system with a moveable effective pivot point. Suitable mechanisms are illustrated in FIGS. 8A to 8D.

Figure 8A:
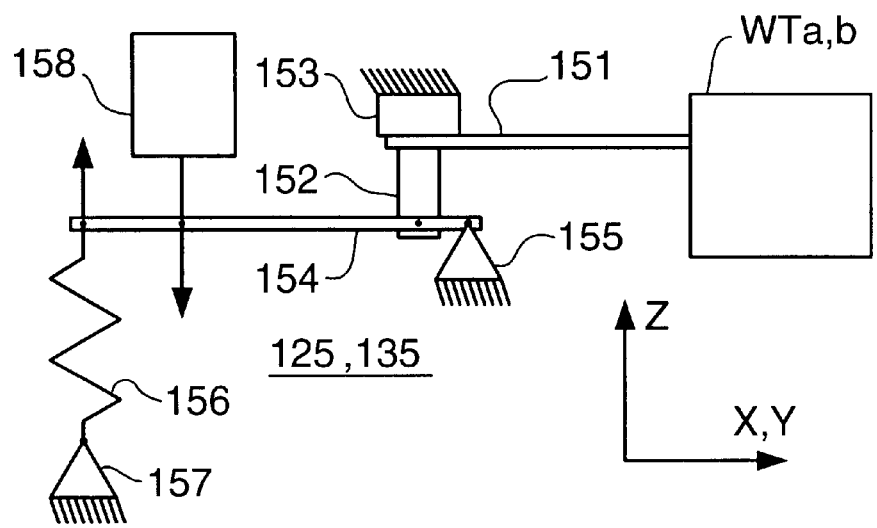
FIGS. 8A to 8D are diagrams of coupling mechanisms for releasably joining the wafer stages to the drive means in the first embodiment of the invention.

FIG. 8A shows a coupling mechanism of the active open type. In this mechanism, a leaf spring 151 generally parallel to the XY plate is fixed to wafer table WTa, WTb and, when the coupling is closed, is clamped between anvil 153, which is fixed to the X-slide 122, 132, and moveable hammer 152. The opposed clamping surfaces of anvil 153 and hammer 152 may be roughened to promote friction or provided with projections, e.g. pins or ridges, or recesses mating with corresponding projections or recesses on the leaf spring 151, according to whether a friction or interlocking clamping principle is desired. Hammer 152 is pivotally connected to lever 154 near a first end thereof The lever 154 is connected, at that first end, to a pivot 155 fixed to the x-slider 122, 132 and, at the opposite second end, to spring 156 which acts against a fixed point 157 on the X-slider 122, 132 to bias the lever so that hammer 152 is pressed against anvil 153 to clamp leaf spring 151. To open the coupling, an opening actuator 158 exerts a force on lever 154 in the opposite sense to the force exerted by spring 156.

Figure 8B:
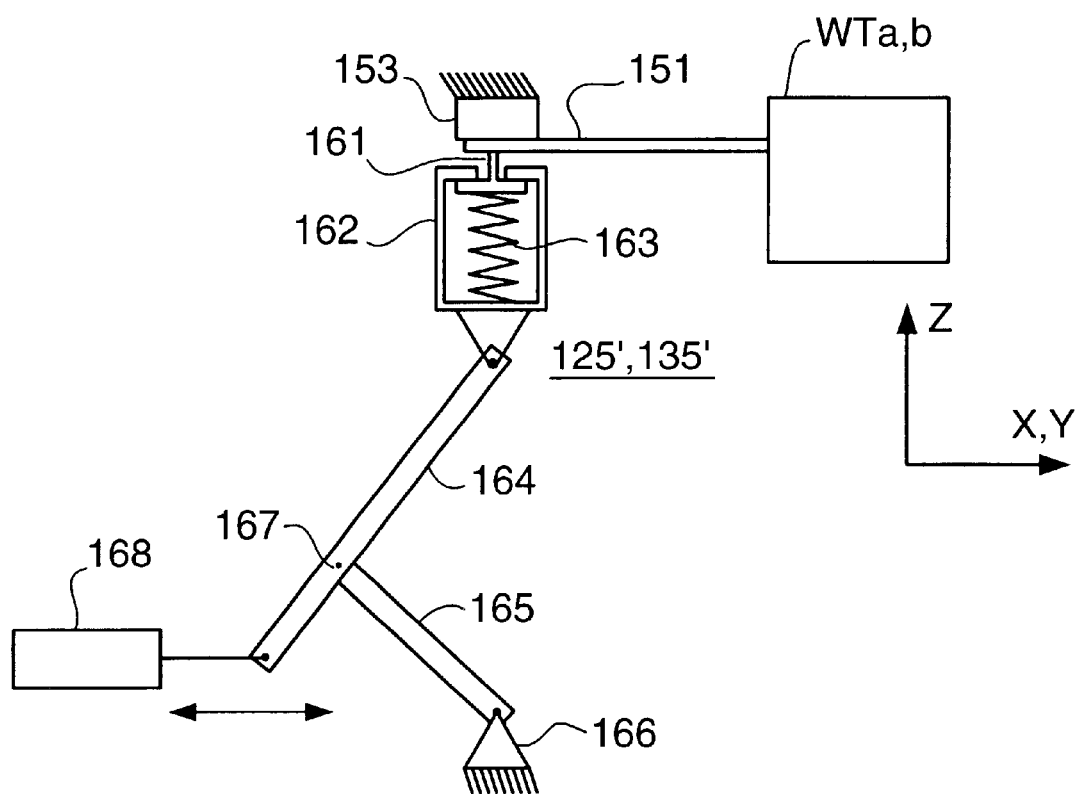

FIG. 8B shows a coupling mechanism of the active toggle type. In this case, anvil 161 is contained by cage 162 but biased by spring 163 to clamp leaf spring 151 against anvil 153. A first lever 164 is pivotally mounted at a first end to the cage 162 and a second lever 165 is pivotally connected between an intermediate pivot point 167 on the first lever and a fixed pivot 166 mounted to the X-slider 122, 132. Actuator 168 exerts force on the end of first lever 164 in a sense to straighten the dog-leg formed by first and second levers 164, 165 to urge the cage 162 toward leaf spring 151 and hence increase the force by which spring 163 urges hammer 161 against anvil 153. The closed state can be made stable by arranging the levers so that the actuator pushes the levers 164, 165 slightly passed the straight position and against a stop (not shown) so as to "lock" the dog-leg.

Figure 8C:
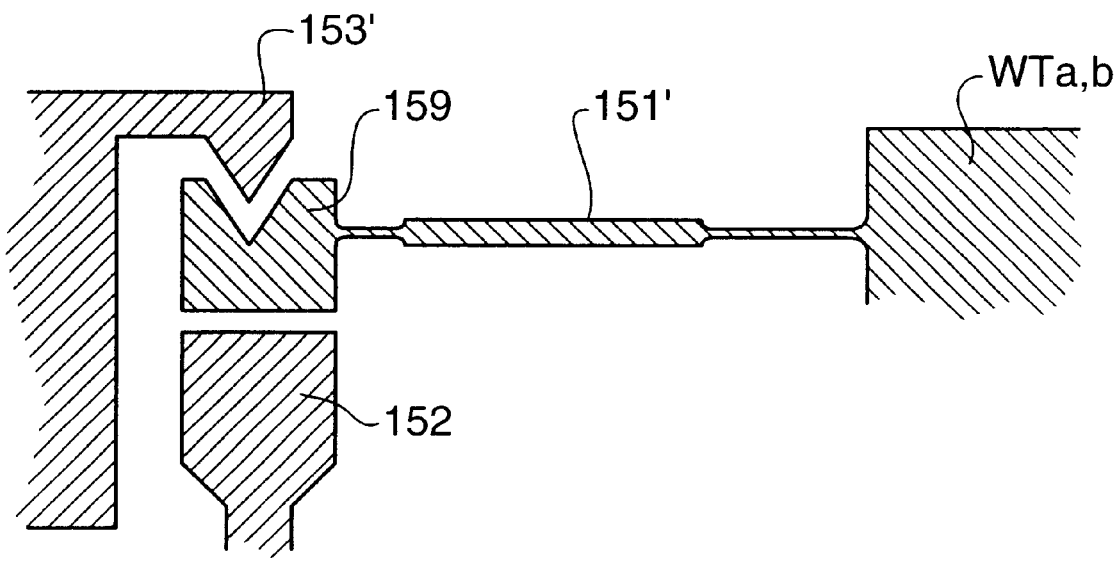

FIGS. 8C and D show an alternative coupling mechanism using a V-ridge and V-groove to improve interlocking; the locking mechanism may be of either the active toggle or active open types described above. In the coupling mechanism of FIGS. 8C and D, the anvil 153' is provided with a V-shaped ridge projecting downwardly and elongate in the X-direction whilst the leaf spring 151' is provided with a termination member having a V-shaped groove corresponding to the V-shaped ridge of the anvil 153'. A hammer 152 is provided to clamp termination member 159 against anvil 153'. It will of course be appreciated that the coupling mechanism could be inverted—i.e. the groove provided on the anvil 153' and the ridge on the termination member 159.

Figure 8D:
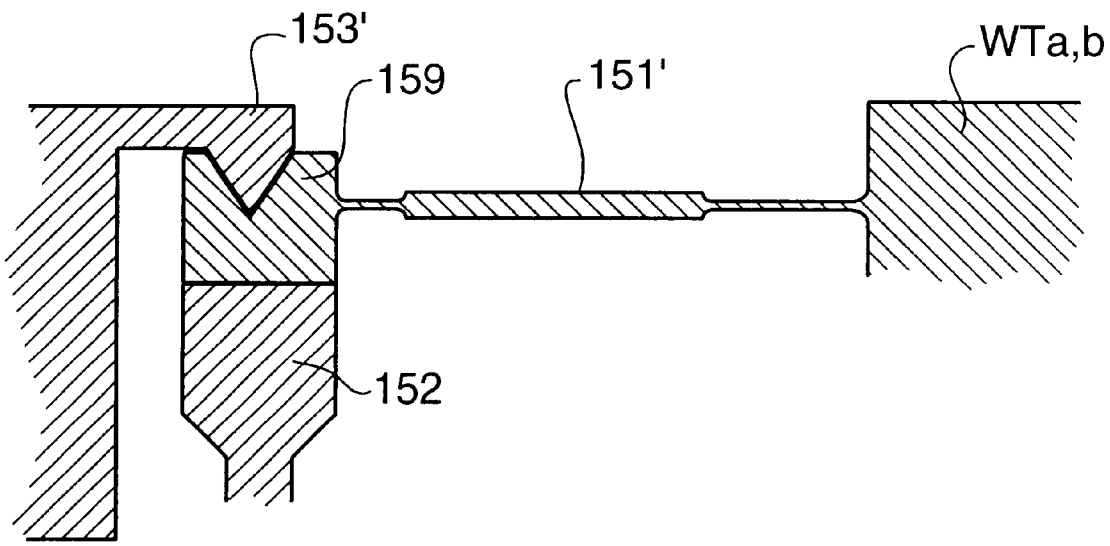

To engage the coupling mechanism of FIGS. 8C and D, the substrate table WTa, b and drive means are positioned so that termination member 159 is positioned between anvil 153' and hammer 152. The hammer 152 is then urged upwards so that the V-shaped ridge enters the V-shaped groove and the termination member 159 is held securely against anvil 153', as shown in FIG. 8D.

The coupling mechanism of FIGS. 8C and D provides several advantages due to the fact that the V-shaped ridge and groove extend parallel to the X-direction. Firstly, the moving mass, and hence the driving forces, are greater in the Y-direction than in the X-direction. Only the wafer stage, X-slider and air foot, etc. move in the X-direction whilst the X-beam and Y-sliders also move in the Y-direction. Thus, the groove and ridge provide an interlock to transfer forces in the Y-direction which are strongest whilst friction is sufficient to transfer forces in the X-direction. At the same time, exchange of the wafer tables between the two drives is facilitated. During the exchange, the X-slider to which the anvil 153' is attached moves only in the X-direction. Thus, the coupling mechanism need only be opened sufficiently to break the connection between termination member 159 and anvil 153' to allow this movement; the greater movement that would be necessary to allow the V-shaped ridge to clear the V-shaped groove is unnecessary. The greater movement would however be required if grooves and ridges extending in both X and Y directions were provided. Reducing the movement of the coupling necessary for an exchange reduces the time taken for that exchange, increasing throughput of the apparatus.

Next will be described the sequence of steps for wafer table exchange, with reference to FIGS. 2 to 7 and 9. FIG. 2 shows the wafer tables in operating position with wafer table WTa in the exposure zone 20 and connected to drive unit 120 whilst wafer table WTb is in the preparation zone 30 and connected to drive unit 130. The aim of the table swap process is to connect wafer table WTa to drive unit 130 and transfer it to the preparation zone 30 whilst synchronously connecting wafer table WTb to drive unit 120 and transferring it to the expose zone 20.

Figure 3:
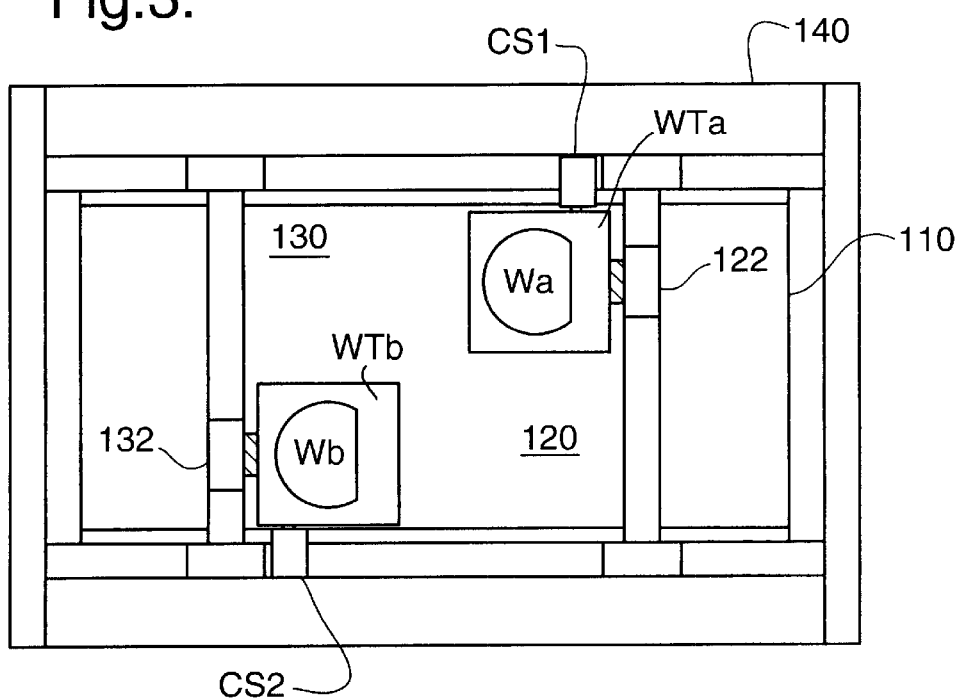
FIG. 3 is a view similar to FIG. 2 but with the tables in the first step of an exchange process.
Figure 9:
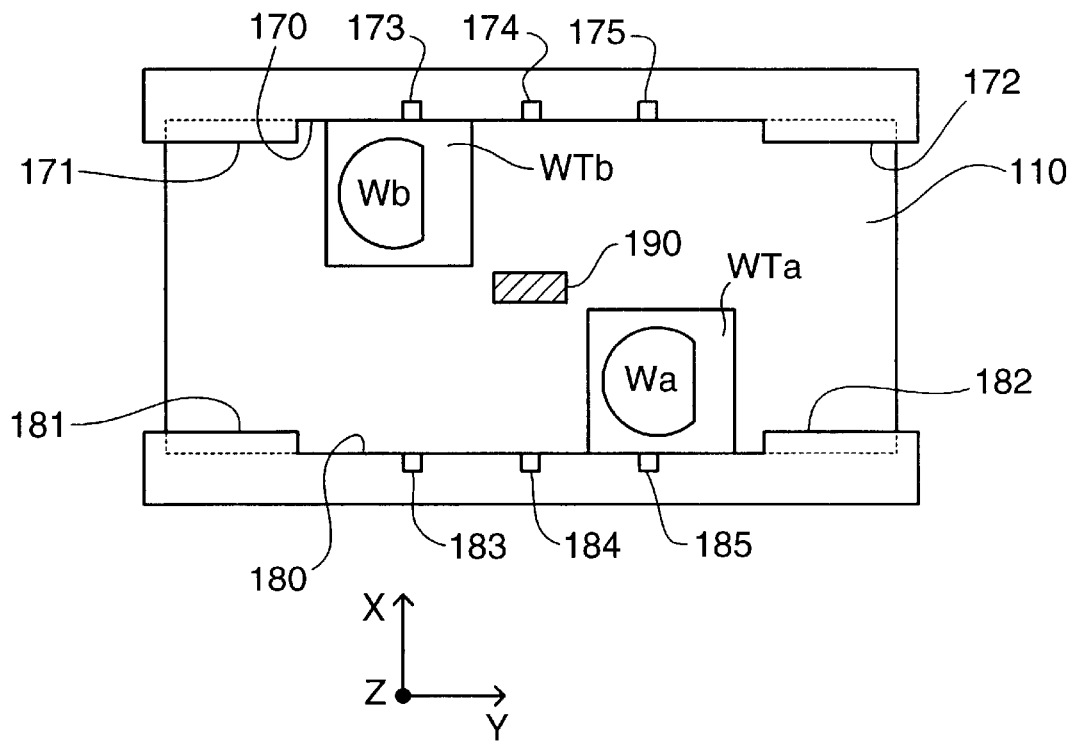
FIG. 9 is a plan view of a labyrinth included in the wafer stage of FIG. 2.

In the first step of the table swap process, shown in FIG. 3, the wafer tables WTa, WTb are moved to the edge of the working zones to engage respective cable shuttles CS1, CS2. The cable shuttles are mounted on side tails of the balance mass 140, or other parallel rails, and are interlinked, e.g. by chains (not shown), to ensure that the wafer tables WTa, WTb are moved in synchronism during the exchange procedure. In this step, the wafer tables WTa WTb also enter the labyrinth, which is shown in FIG. 9 and comprises sidewalls 170, 180 and center post 190. The side walls 170, 180 have projecting shoulders 171, 172, 181, 182 at each end which project over the sides of the reference table 110 so that the effective movement range of the wafer tables is narrower in the working zones, that is the exposure zone and preparation zone, than in the central area. The center post is situated in the middle of the reference table 110 and sized to prevent the wafer tables moving in a straight line from exposure zone 20 to preparation zone 30 and vice versa. Instead, the wafer tables must move past the ends of the shoulders 171, 172, 181, 182 before moving outwardly to the side rails in the transfer zones 40a, 40b. This is the position shown in FIG. 3. Sensors 173, 174, 175, 183, 184, 185 can be provided to detect the wafer tables as they pass specific points in the labyrinth.

Figure 4:
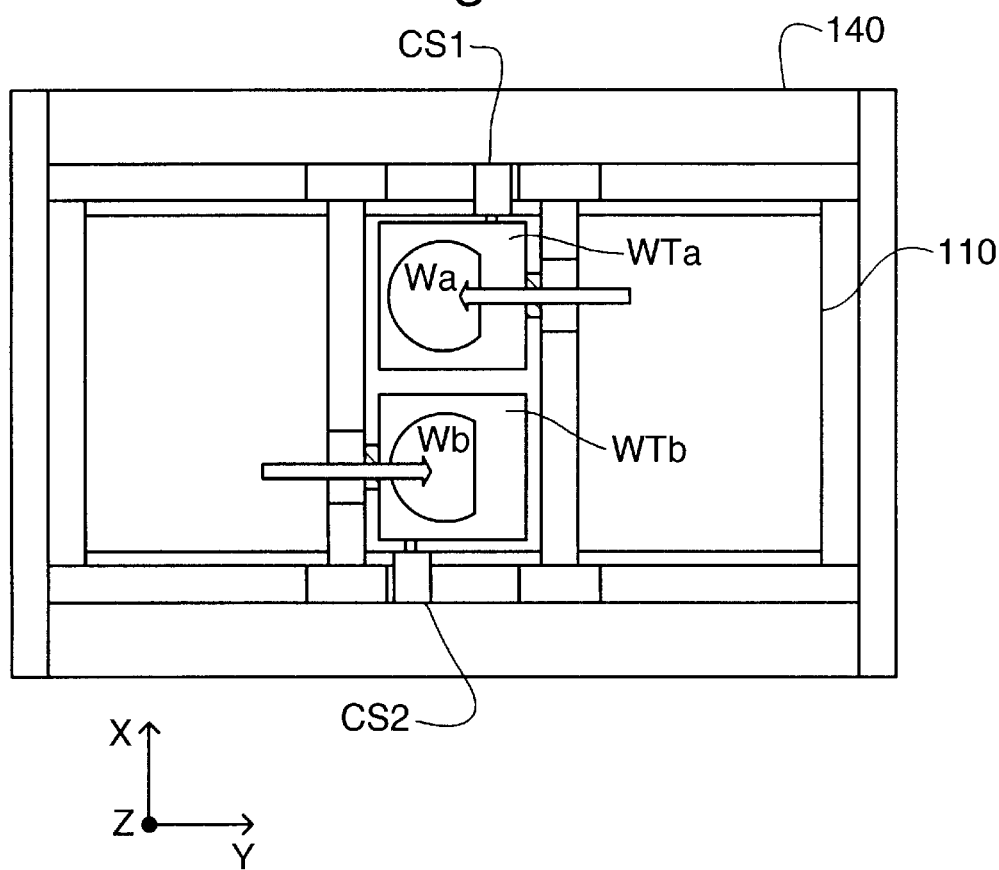
FIG. 4 is a view similar to FIG. 2 but with the tables in the second step of an exchange process.

In step two, the wafer stages WTa, WTb are moved forward until they are side-by-side in the transfer zones 40a, 40b, as shown in FIG. 4. The interlink between cable shuttles CS1, CS2 ensures that this step cannot take place unless both wafer tables are linked to respective ones of the cable shuttles and moved in synchronism under software control. The interlink does not drive the tables but presents any erroneous software commands that might lead to out of synchronism movements. It is thereby ensured that a table cannot be moved into one of the working zones unless the table previously there is moved out at the same time. The cable shuttles support the control cables and other utility conduits to their respective tables. This and the fact that the tables can only pass the central pillar on their own sides ensure that the cables cannot become entangled.

Figure 5:
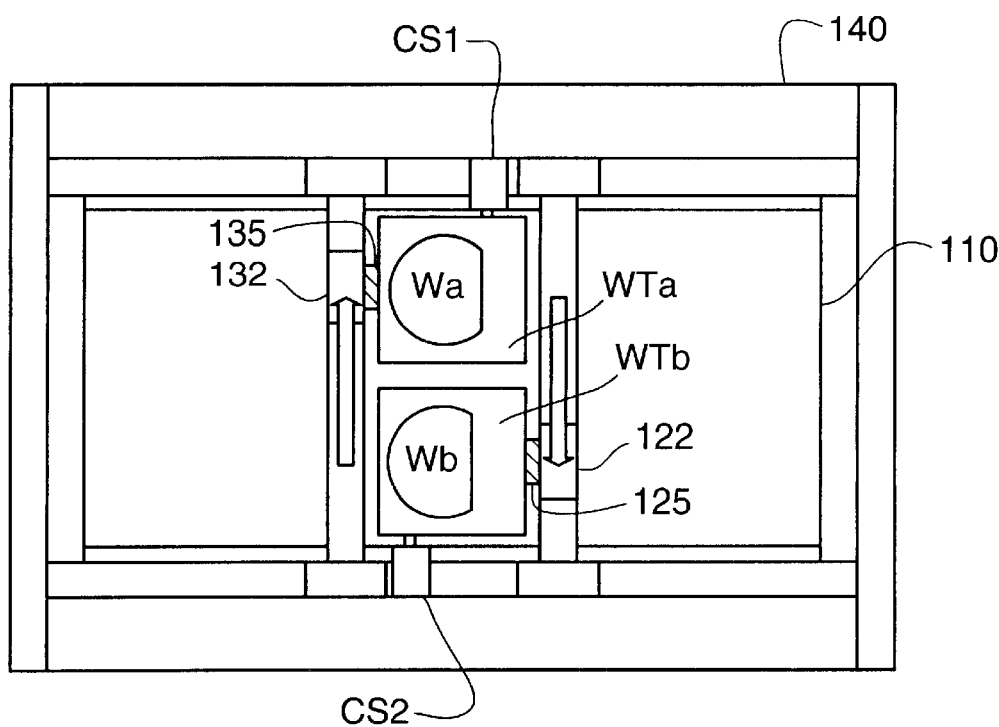
FIG. 5 is a view similar to FIG. 2 but with the tables in the third step of an exchange process.

In step three, the wafer tables WTa, WTb are anchored to the reference table 110, e.g. by softly turning off the air feet that support them. Alternatively, pins or the like normally concealed in recesses or holes in the balance mass may be protruded to secure the tables. Then, coupling mechanisms 125, 135 are opened to release the wafer tables from the X-sliders to which they were originally attached. The X-sliders 122, 132 are then moved so as to be adjacent the other wafer table, as shown in FIG. 5, and coupling mechanisms 125, 135 re-engaged. Thus wafer table WTa is now connected to drive unit 130 and wafer table WTb is now connected to drive unit 120.

Figure 6:
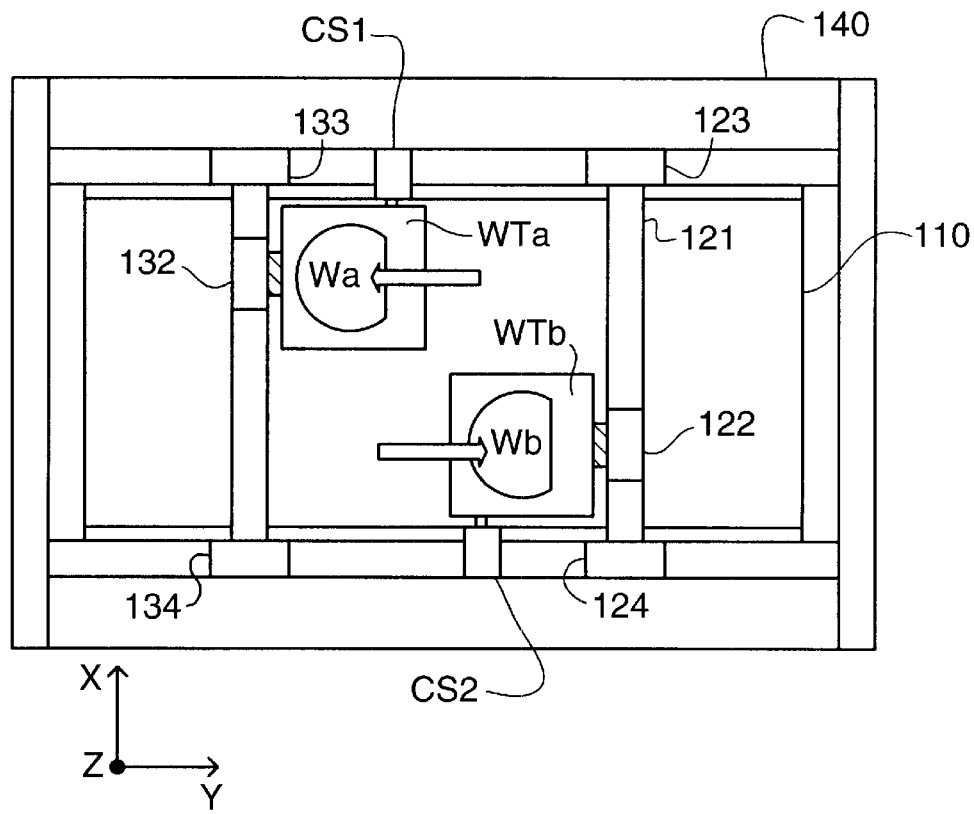
FIG. 6 is a view similar to FIG. 2 but with the tables in the fourth step of an exchange process.

In step four, the wafer tables WTa, WTb are moved by the drive units 130, 120 to which they have been transferred towards their respective destinations, as shown in FIG. 6. During this process, the wafer tables are still connected to cable shuttles CS1, CS2 which ensure that they move in synchronism.

Figure 7:
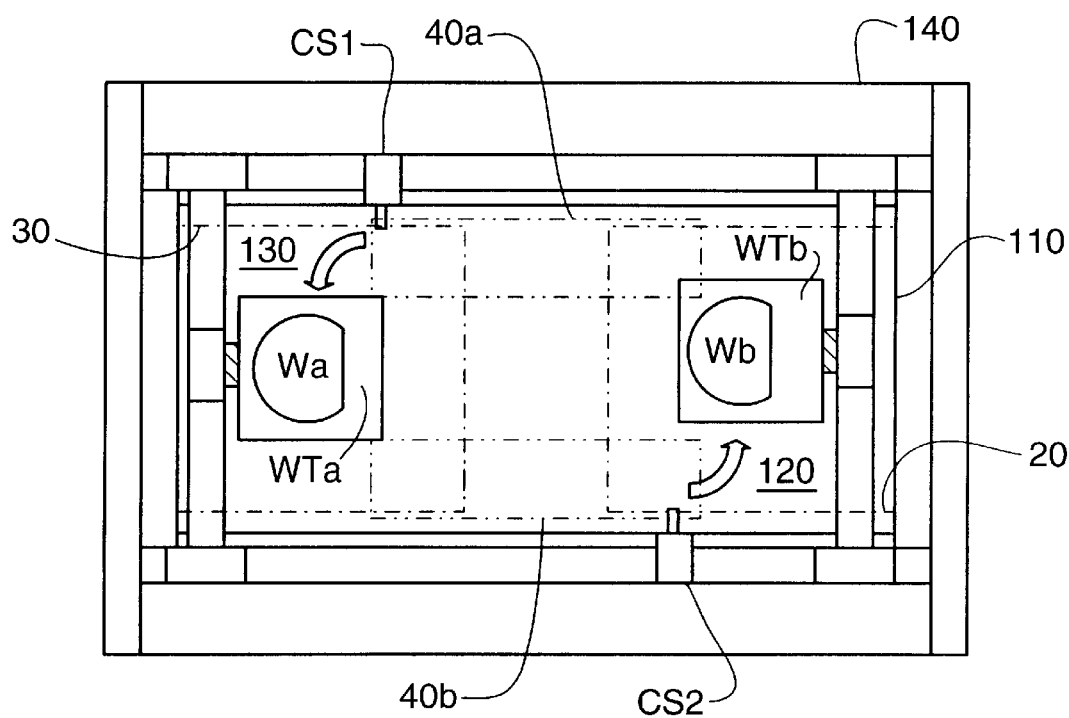
FIG. 7 is a view similar to FIG. 2 but with the tables in the fifth step of an exchange process.

Finally, once the wafer tables have been moved past the center post 190 they are released from cable shuttles CS1, CS2 and moved to their operating positions. Wafer table WTa is now in the preparation zone 30 and wafer table WTb is now in exposure zone 20, as shown in FIG. 7.

Embodiment 2

A second embodiment of the invention is shown in FIGS. 10 to 13. In this embodiment the possibility of a crash is further reduced by providing the cable shuttles CS1', CS2' with drives so that they, rather than the drive units 120, 130, effect the transfer of the wafer tables between measurement and expose zones.

Figure 10:
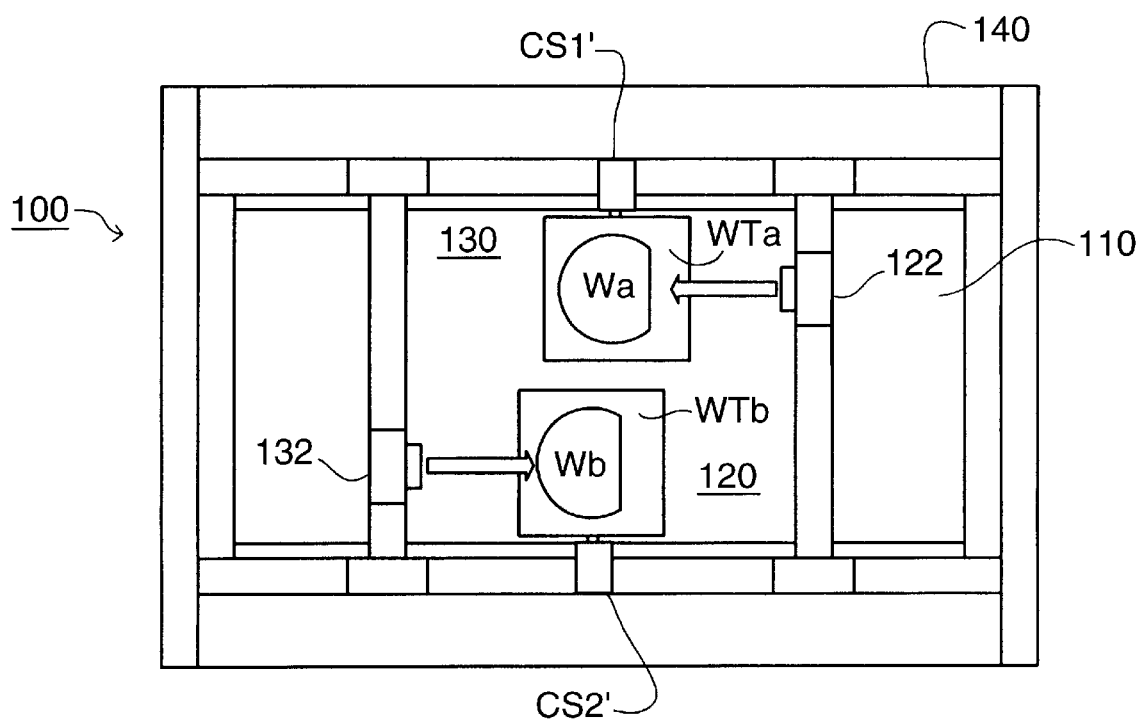
FIG. 10 is a plan view of the wafer stage of a second embodiment of the invention with the wafer tables in the second step of an exchange or swap process.

The first step in the transfer process in the second embodiment is the same as that in the first; the wafer tables WTa, WTb are moved into the labyrinth to engage cable shuttles CS1', CS2' respectively. In the second step, rather than being guided through the labyrinth by the drives 120, 130, coupling mechanisms 125, 135 are released to disengage the wafer tables WTa, WTb from drive units 120, 130. The wafer tables WTa, WTb are then driven through the labyrinth by cable shuttles CS1', CS2', as shown in FIG. 10. The first and second steps in the second embodiment can be carried out "on-the-fly" to reduce the time taken for the transfer. In this arrangement, the wafer tables WTa, WTb are driven into the labyrinth by drive units 120, 130 which continue to accelerate them in the Y direction whilst the cable shuttles CS1', CS2' engage the respective tables. Once the wafer tables WTa, WTb are moving at constant speed, the drive units 120, 130 are disengaged and the remainder of the tables' movement through the labyrinth is driven by the cable shuttles CS1', CS2'. As well as reducing the time taken for change over, with this arrangement the performance specifications of the cable shuttle drives are reduced. The cable shuttles CS1 and CS2 may also serve as a collision prevention means for preventing collisions between the Y-sliders 123 and 133 and between the Y-sliders 124, 134.

Figure 11:
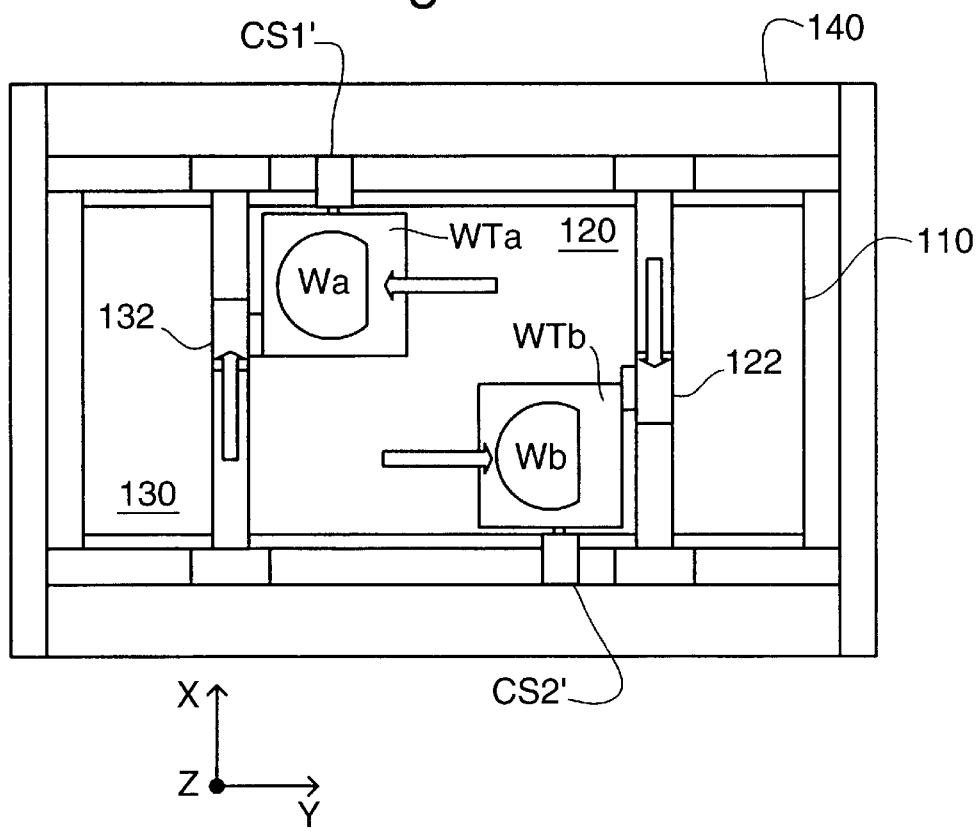
FIG. 11 is a view similar to FIG. 10 but with the tables in the third stage of a swap process.
Figure 12:
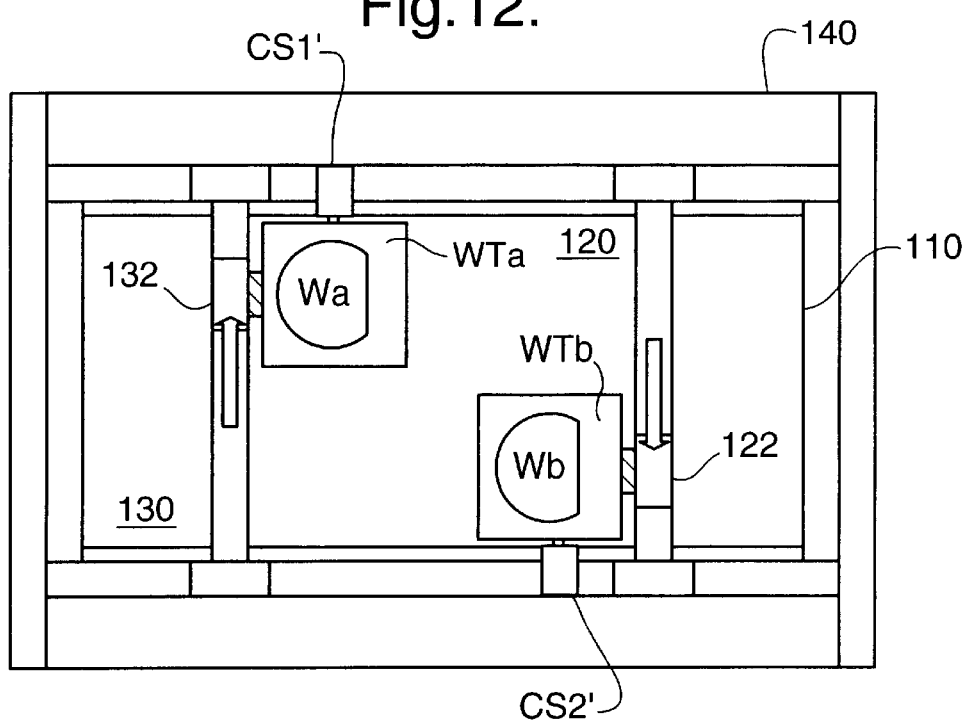
FIG. 12 is a view similar to FIG. 10 but with the tables in the fourth stage of a swap process.
Figure 13:
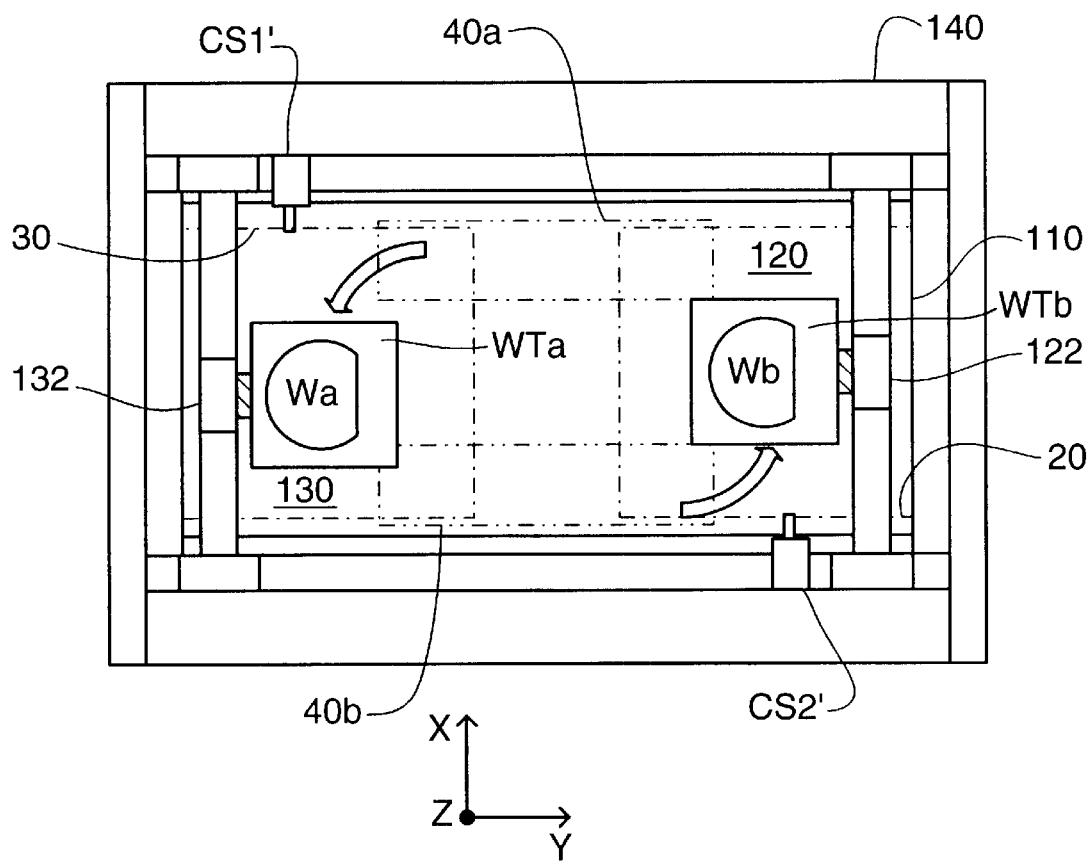
FIG. 13 is a view similar to FIG. 10 but with the tables in operating positions after completion of a swap.

Once the drive units 120, 130 have been released from the wafer tables WTa, WTb, the X-sliders 122, 132 are moved over to the other side, as shown in FIG. 11, where they re-engage the other table, FIG. 12, before the cable shuttles CS1' and CS2' are released and the tables moved into the working zones, FIG. 13. The re-engagement of the drive units 120, 130 and the release from the cable shuttles can also be carried out on the fly, in the reverse of the process described above.

Embodiment 3

Figure 14:
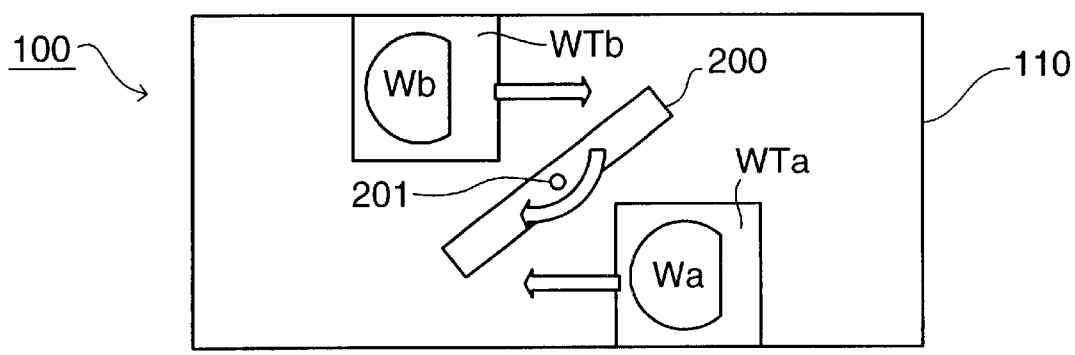
FIG. 14 is a plan view of the wafer stage of a third embodiment of the invention.

In a third embodiment, shown in FIG. 14, the labyrinth arrangement is replaced by a revolving barrier or door 200. Otherwise, the third embodiment may be the same as either the first or second embodiment.

Revolving barrier 200 is mounted on a pivot 201 in the center of the reference table 110. To begin the transfer of wafer tables WTa, WTb, they are driven to diagonally opposite positions either side of pivot 201. The wafer tables WTa, WTb are then driven through the transfer zones 40a, 40b in synchronism with each other and the rotation of the barrier 200. In this embodiment, synchronization of the moving bodies during the transfer process is controlled by software. However, even in the event of a major failure, such as software error, unexpected power loss or interference, the revolving barrier 200 will always be between the two tables WTa, WTb preventing them coming into contact.

In an alternative arrangement the same effect is achieved with retractable barriers; one which projects in a first position when the wafer tables are in the working zones and a second which projects in a second position to define two paths for the transfer process.

The third embodiment is particularly useful in conjunction with long stroke drive arrangements, e.g. using planar motors, where each drive unit can position the respective wafer table over the whole area of the reference table 110, as well as drive arrangements, such as employed in the first and second embodiments, where a handover between drive units covering respective halves of the reference table is required during the transfer process.

Embodiment 4

Figure 15:
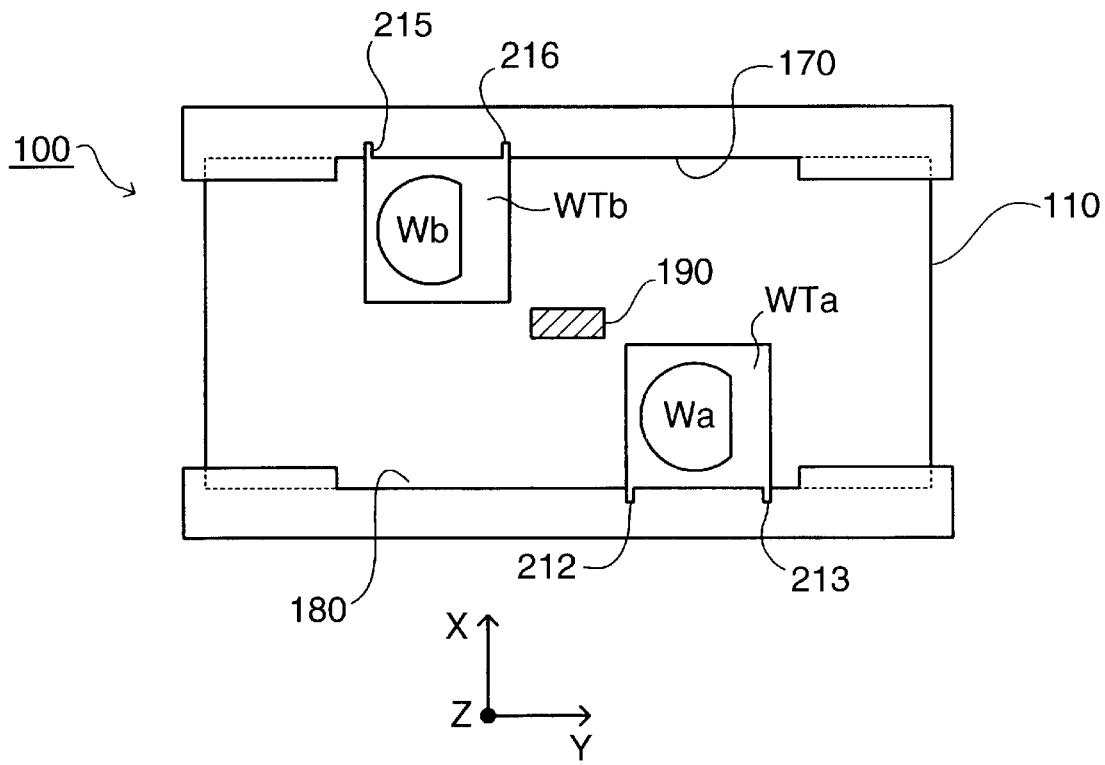
FIG. 15 is a plan view of the wafer stage of a fourth embodiment of the invention.
Figure 16:
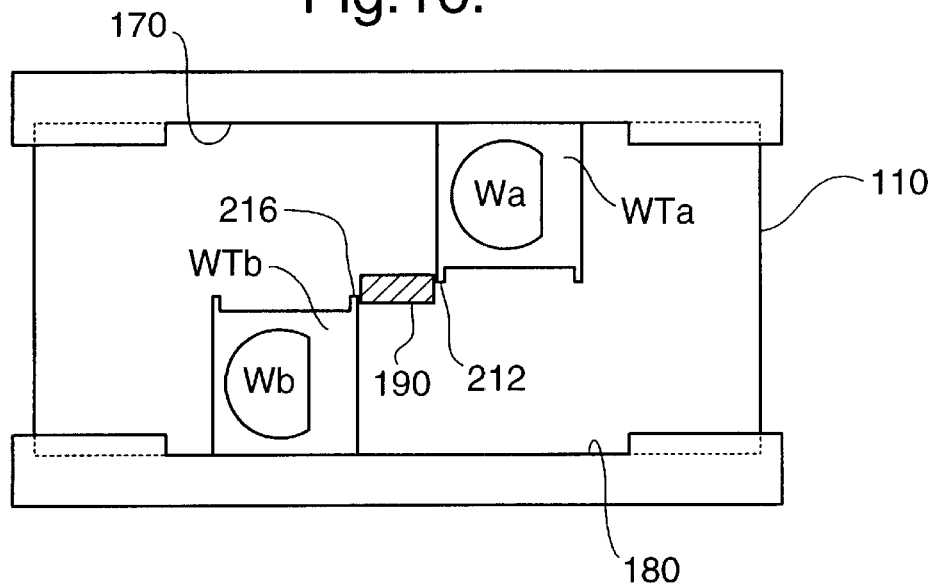
FIG. 16 is a plan view of the wafer stage of the fourth embodiment of the invention showing how the tables are prevented from passing on the wrong side of the central post.

In a fourth embodiment, shown in FIGS. 15 and 16, the wafer table WTa, WTb are provided with projections 212, 213, 215, 216 which, in combination with the side walls 170, 180, ensure that each wafer table can only pass through the labyrinth on its own side of the center pole 190.

As shown in FIG. 15, when each wafer table WTa, WTb is on the correct side of center pole 190, the projections 212, 213, 215, 216 extend over the top of side walls 170, 180 and the wafer tables WTa, WTb can be positioned sufficiently closely to the sides of the reference table 110 to allow them to pass between the side walls 170, 180 and center post 190. Alternatively, the projections may enter corresponding grooves in the side walls to allow the wafer tables to move close enough to the sides of reference table 110. However, the center post 190 is arranged to project higher than the side walls 170, 180 so that when a wafer table is on the "wrong" side of the center post 190, as shown in FIG. 16, the wafer table cannot pass between the center post 190 and the side wall.

Projections 212, 213, 215, 216 prevent the possibility of a crash occurring in a situation in which a table is moving on a diagonal course toward the "wrong" side of the pillar when a power loss occurs and the other table is moved to the table swap preparatory position. Without the projections 212, 213, 215, 216, the table might bounce off the sidewalls and, at least partially, pass through the gap to collide with the other table.

Embodiment 5

Figure 17:
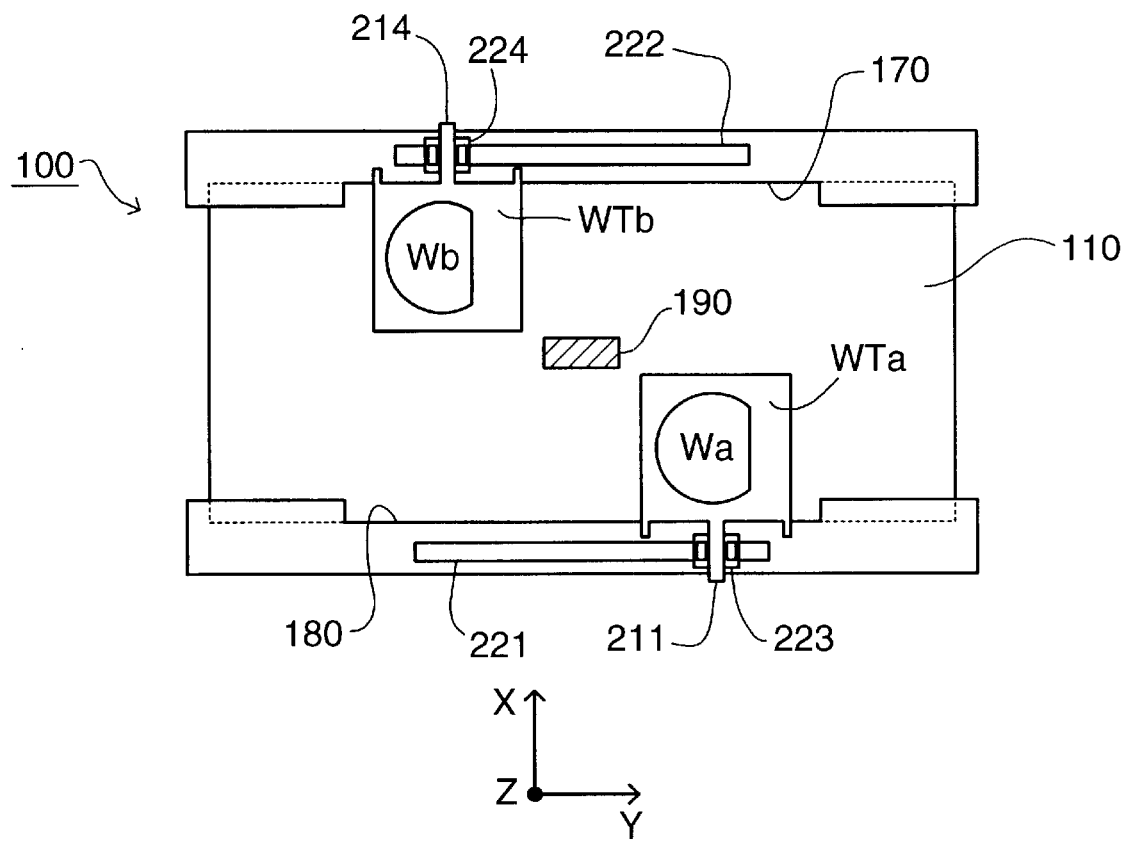
FIG. 17 is a plan view of the wafer stage of a fifth embodiment of the invention.

A fifth embodiment, shown in FIG. 17, employs swap rails 221, 222 mounted on the labyrinth sidewalls 170, 180 in place of the cable shuttles of the first and second embodiments. At the beginning of the transfer process, the wafer tables WTa, WTb are driven to entry positions in their respective sides of the labyrinth. In these positions, projections 211, 214 on the wafer tables engage swap carriages 223, 224, which are mounted, on the swap rails 221, 222. Once engaged to the swap carriages, the tables are fixed in X and any movement in this direction is prevented. The energy of any collisions in this direction is absorbed by the swap rails. The swap carriages 223, 224 may be interlinked, e.g. by a chain or electronically, so that they can only move together and only when both are engaged with their respective wafer table WTa, WTb.

Figure 18:
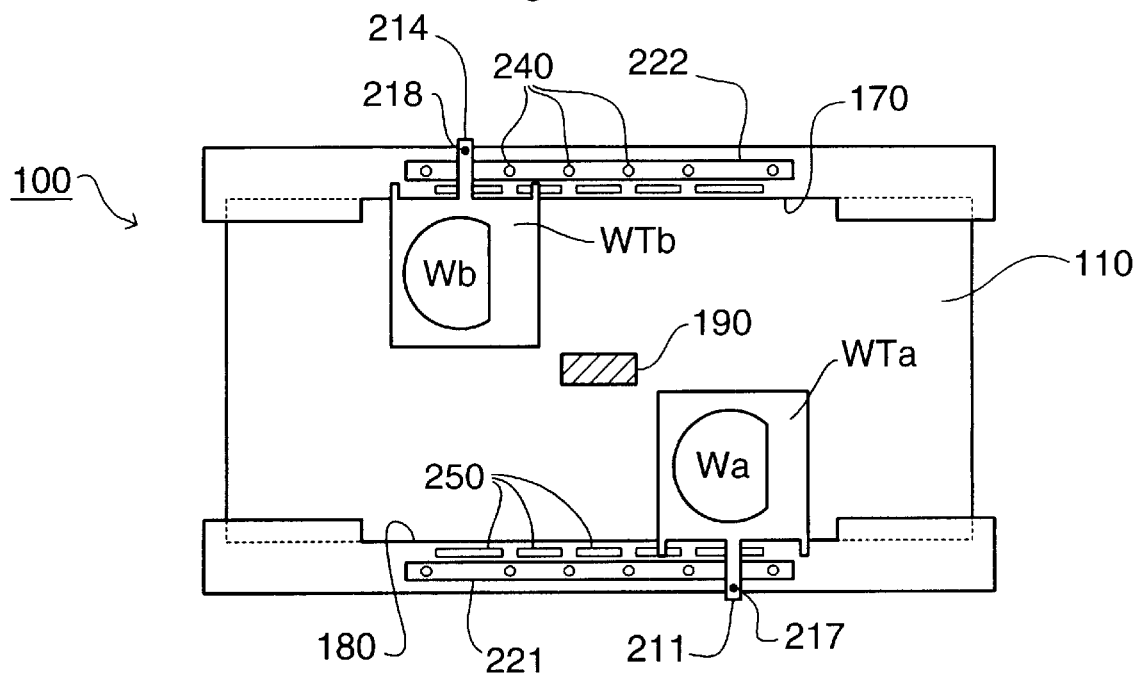
FIG. 18 is a plan view of the wafer stage of a modification of the fifth embodiment of the invention.

In a modification of the fifth embodiment, shown in FIG. 18, the carriages are dispensed with and the projections 211, 214 have hooks 217, 218 which engage directly onto the swap rails 221, 222. Again the swap rails prevent movement in X and absorb the energy of any collisions in the X direction when the tables are engaged to them via projections 211, 216 and hooks 217, 218.

In this modification of the fifth embodiment the swap rails are divided into zones by pins 240 and sensors 250 are provided to detect the presence of the table in each zone. The pins are normally recessed into the swap rails but a control system is provided so that if the outputs of sensors 250 indicate that the tables are not moving in synchronism the pins are caused to project from the swap rails 221, 222 to trap the projections 211, 216, and hence the table WTa, WTb, in Y as well as X. Preferably, the pins 240 are spring biased to project and retracted by active actuators, e.g. electromagnets, so that they will automatically project in the event of power failure.

Embodiment 6

In a sixth embodiment (not illustrated) the transfer process is effected by a double-ended robot arm which engages the two wafer tables WTa, WTb in the working zones 20, 30, one at each end. The tables are then released from their long stroke drive units and the robot arm rotates to swap the two wafer tables between working zones.

An alternative to the robot arm is a swapping carriage that moves only in the Y direction. For the transfer process the wafer tables are moved to diagonally opposite positions by their respective drive units and then moved one at a time by the swapping carriage between the two working zones. The transfer is carried out so that the wafer tables are at all times engaged to either a drive unit or the swapping carriage.

Embodiment 7

Figure 19:
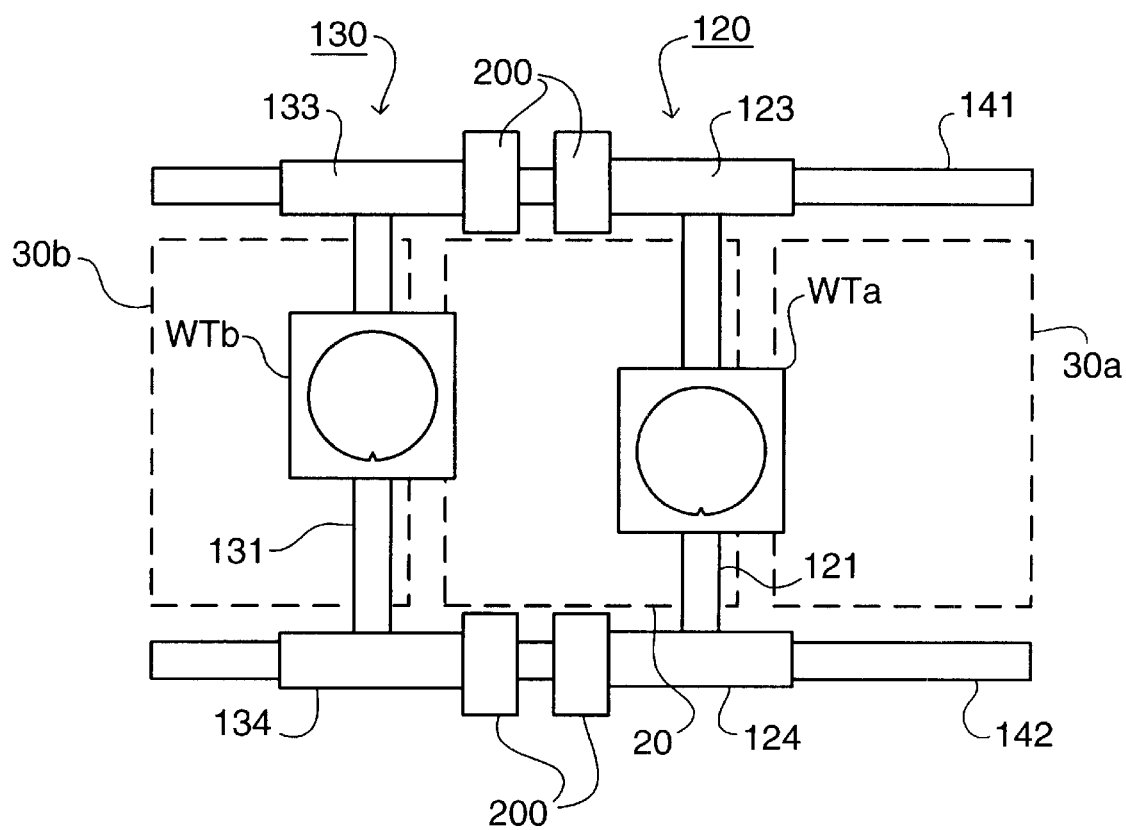
FIG. 19 is a plan view of the wafer stage of a sixth embodiment of the invention.

In a seventh embodiment, shown in FIG. 19, the two substrate tables WTa, WTb move between respective characterization zones 30a, 30b and a central, shared expose zone 20. The substrate tables remain at all time coupled to their respective drive units 120, 130 so that there is no exchange as such.

Whilst the control systems (software) of the apparatus are programmed to ensure that only one of substrate tables WTa, WTb is positioned in the expose zone 20 at any one time, nevertheless a software error or machine failure might result in both tables moving into the expose area at the same time, leading to a potential crash situation. To prevent a physical collision between the fragile tables WTa, WTb, collision prevention means 200 are provided on the Y-sliders 123, 124, 133, 134. The collision prevention means 200 comprise shock absorbers positioned and with sufficient shock absorbing capacity to ensure that the two substrate tables cannot come into actual contact.

In all the embodiments described above, the physical barrier means that prevent crashes between the two wafer tables, e.g. the center post 190, side walls 170, 180, and revolving barrier 200, as well as the tables themselves, may be provided with shock absorbers. For example, it is possible to build a bumper comprising shock absorbers around the wafer table. The bumper can absorb all possible shocks occurring in a crash such that the wafer table will not be damaged. Such shock absorbers may be effected by making the relevant items wholly or partially from resilient materials or by providing active or passive shock absorbing devices, e.g. air bags, fenders, buffers, hydraulic dampers, springs, etc.

Whilst we have described above specific embodiments of the invention, it will be appreciated that the invention may be practiced otherwise than described. The description is not intended to limit the invention. In particular it will be appreciated that the invention may be used in the reticle or mask stage of a lithographic apparatus and in any other type of apparatus where fast and accurate positioning of an object in a plane is desirable.

What is claimed is:

1. A lithographic projection apparatus comprising:
   a projection beam radiation system which supplies a projection beam of radiation;
   a first object table for holding a projection beam pattern device which patterns the projection beam according to a desired pattern;
   second and third movable object tables each for holding a substrate, said second and third object tables being movable over a common range of movement including at least first and second working zones; and
   a beam projection system which images the patterned beam onto a target portion of the substrate; and
   a table actuator which moves said second and third object tables,
   said actuator including structure physically limiting movement of at least one of said second and third object tables thereby preventing collisions between said second and third object tables.

2. Apparatus according to claim 1 wherein said collision prevention structure comprises a labyrinth defining two distinct paths between said first and second working zones.

3. Apparatus according to claim 2 wherein said labyrinth comprises first and second side walls and a post disposed between said side walls so that said distinct paths are defined between said post and side walls.

4. Apparatus according to claim 2 wherein said distinct paths are not straight.

5. Apparatus according to claim 2 wherein said second and third object tables and said labyrinth are shaped and dimensioned so that said second and third object tables may only traverse respective ones of the distinct paths.

6. Apparatus according to claim 1 wherein said collision prevention structure comprises first and second shuttles each moveable between first and second positions proximate said first and second working zones respectively, said shuttles being interlinked so that as one moves from the first position to the second position the other moves from the second position to the first position and so as to be moveable only when each is connected to a different one of said second and third object tables.

7. Apparatus according to claim 6 wherein said shuttles include transfer drive actuators which drive said object tables during movement between said first and second working zones.

8. Apparatus according to claim 1 wherein said collision prevention structure comprises a rotatable barrier pivotally mounted in said range of movement between said first and second working zones so as to be rotatable between a first state in which said barrier separates said first and second working zones and a second state in which said barrier defines on either side two distinct paths by which said second and third object tables can be moved between said first and second working zones.

9. Apparatus according to claim 1 further comprising first and second drivers each selectively coupleable to either of said second and third object tables, said first driver being capable of positioning an object table in said first working zone and a transfer zone, said second driver being capable of positioning an object table in said second working zone and said transfer zone.

10. Apparatus according to claim 9 wherein each of said first and second drivers comprises a releasable coupler which engages either said second or third object table, said releasable coupler having a fail-safe state in which engagement to one of said object tables is maintained.

11. Apparatus according to claim 9 wherein each of said first and second drivers comprises a releasable coupling having a V-shaped ridge cooperating with a V-shaped groove.

12. Apparatus according to claim 1 wherein said collision prevention structure comprises a shock absorber mounted to a moving part of said table actuator for absorbing energy to prevent a collision between said object tables.

13. Apparatus according to claim 1 further comprising a substrate loader which loads and removes substrates to said second and third object tables in said first working zone; and wherein said projection system is arranged for imaging the patterned beam onto a target portion of a substrate provided on one of said object tables in said second working zone.

14. A lithographic projection apparatus comprising:

a projection beam radiation system which supplies a projection beam of radiation;

first and second movable object tables each for holding a projection beam pattern device which patterns the projection beam according to a desired pattern, said first and second object tables being moveable over a common range of movement including at least first and second working zones;

a third movable object table for holding a substrate;

a beam projection system which images the patterned beam onto a target portion of the substrate; and table positioning means for moving said first and second object tables; and collision prevention structure physically limiting movement of at least one of said first and second object tables for preventing collisions between said first and second object tables.

15. A method of manufacturing a device comprising:

providing a projection beam of radiation using an illumination system;

patterning the projection beam with a pattern in its cross-section;

positioning a second object table in a first working zone and a third object table in a second working zone;

providing a first substrate having a radiation-sensitive layer to said second object table in said first working zone;

exchanging said second and third object tables between said first and second working zones;

projecting the patterned beam of radiation onto a target portion of the layer of radiation-sensitive material of said first substrate provided to said second object table;

providing a second substrate having a radiation-sensitive layer to said third object table in said first working area;

again exchanging said second and third object tables between said first and second working zones; and during said steps of exchanging said second and third object tables, physically limiting movement of at least one of said second and third object tables to prevent collisions between said second and third object tables.

16. A device manufactured according to the method of claim 15.

* * * * *